(12) United States Patent
Park

(10) Patent No.: US 11,670,803 B2
(45) Date of Patent: Jun. 6, 2023

(54) BATTERY PACK AND MANUFACTURING METHOD THEREFOR

(71) Applicant: SAMSUNG SDI CO., LTD., Yongin-si (KR)

(72) Inventor: Sang Hun Park, Yongin-si (KR)

(73) Assignee: SAMSUNG SDI CO., LTD., Yongin-si (KR)

(*) Notice: Subject to any disclaimer, the term of this patent is extended or adjusted under 35 U.S.C. 154(b) by 0 days.

(21) Appl. No.: 16/769,728

(22) PCT Filed: Oct. 11, 2018

(86) PCT No.: PCT/KR2018/011955
§ 371 (c)(1),
(2) Date: Jun. 4, 2020

(87) PCT Pub. No.: WO2019/135470
PCT Pub. Date: Jul. 11, 2019

(65) Prior Publication Data
US 2020/0373544 A1 Nov. 26, 2020

(30) Foreign Application Priority Data

Jan. 2, 2018 (KR) ........................ 10-2018-0000286

(51) Int. Cl.
*H01M 50/531* (2021.01)
*H01M 10/04* (2006.01)
(Continued)

(52) U.S. Cl.
CPC ..... *H01M 50/531* (2021.01); *H01M 10/0404* (2013.01); *H01M 10/42* (2013.01);
(Continued)

(58) Field of Classification Search
CPC ............... H01M 50/531; H01M 50/10; H01M 10/0404; H01M 10/42
See application file for complete search history.

(56) References Cited

U.S. PATENT DOCUMENTS 5,446,257 A 8/1995 Sakamoto et al.
8,574,751 B2 11/2013 Jang et al.
(Continued)

FOREIGN PATENT DOCUMENTS

CN 106735898 A 5/2017
CN 107335915 A 11/2017
(Continued)

OTHER PUBLICATIONS

Filler metal, Wikipedia; https://web.archive.org/web/20160126061221/ https://en.wikipedia.org/wiki/Filler_metal; Published 2016 (Year: 2016).*

(Continued)

*Primary Examiner* — Jimmy Vo
(74) *Attorney, Agent, or Firm* — Lee IP Law, P.C.

(57) ABSTRACT

The present invention relates to a battery pack capable of securing a welding strength between a tab plate and an electrode tab, and a manufacturing method therefor. As an example, disclosed is a battery pack comprising: a battery cell from which an electrode tab is withdrawn; and a protection circuit module which is electrically connected to the battery cell and which has a circuit board and a tab plate formed on one surface of the circuit board and electrically connected to the electrode tab, wherein the tab plate has a through hole for heating the electrode tab.

2 Claims, 7 Drawing Sheets

(51) Int. Cl.
  *H01M 10/42* (2006.01)
  *H01R 43/02* (2006.01)
  *H05K 3/32* (2006.01)
  *H01M 50/10* (2021.01)

(52) U.S. Cl.
  CPC ........ *H01M 50/10* (2021.01); *H01R 43/0221* (2013.01); *H05K 3/328* (2013.01)

(56) References Cited

U.S. PATENT DOCUMENTS

| | | | |
|---|---|---|---|
| 8,685,552 B2 | 4/2014 | Kwag et al. | |
| 8,722,217 B2 | 5/2014 | Lee | |
| 9,735,399 B2 | 8/2017 | Kim et al. | |
| 2003/0121142 A1* | 7/2003 | Kikuchi | B23K 11/11 |
| | | | 29/623.4 |
| 2007/0199926 A1 | 8/2007 | Watanabe et al. | |
| 2008/0118820 A1 | 5/2008 | Jang et al. | |
| 2008/0253410 A1 | 10/2008 | Sakurai et al. | |
| 2010/0159287 A1 | 6/2010 | Kwag et al. | |
| 2010/0316893 A1 | 12/2010 | Kim | |
| 2012/0121945 A1 | 5/2012 | Kim | |
| 2012/0288324 A1 | 11/2012 | Ishikawa et al. | |
| 2013/0344353 A1 | 12/2013 | Jang et al. | |
| 2014/0287280 A1 | 9/2014 | Kim et al. | |
| 2015/0001196 A1 | 1/2015 | Kim et al. | |
| 2015/0030917 A1 | 1/2015 | You et al. | |
| 2016/0199938 A1 | 7/2016 | de Natris | |
| 2017/0229686 A1* | 8/2017 | Takasu | H01M 50/172 |
| 2020/0274133 A1 | 8/2020 | Masumura et al. | |

FOREIGN PATENT DOCUMENTS

| | | | | |
|---|---|---|---|---|
| EP | 2 309 570 A1 | | 4/2011 | |
| JP | H07251284 A | | 10/1995 | |
| JP | H09190812 A | | 7/1997 | |
| JP | 2006-324323 A | | 11/2006 | |
| JP | 2007-222937 A | | 9/2007 | |
| JP | 2007-265962 A | | 10/2007 | |
| JP | 2009-166080 A | | 7/2009 | |
| JP | 2017-147209 A | | 8/2017 | |
| KR | 10-2008-0045946 A | | 5/2008 | |
| KR | 10-2010-0070838 A | | 6/2010 | |
| KR | 20100070838 A | * | 6/2010 | |
| KR | 10-1312424 B1 | | 9/2013 | |
| KR | 10-1425800 B1 | | 8/2014 | |
| KR | 10-1432224 B1 | | 8/2014 | |
| KR | 10-2015-0012995 A | | 2/2015 | |
| KR | 10-2015-0098833 A | | 8/2015 | |
| WO | WO-2006068383 A1 | * | 6/2006 | ........ H01M 10/4207 |

OTHER PUBLICATIONS

European Search Report dated Nov. 8, 2021.
International Search Report dated Jan. 23, 2019 for PCT/KR2018/011955.
Chinese Office action dated Jan. 18, 2023 for corresponding CN 201880083525.2.

* cited by examiner

BATTERY PACK AND MANUFACTURING METHOD THEREFOR

CROSS REFERENCE TO RELATED APPLICATIONS

This is the U.S. national phase application based on PCT Application No. PCT/KR2018/011955, filed Oct. 11, 2018, which is based on Korean Patent Application No. 10-2018-0000286, filed Jan. 2, 2018, the entire contents of all of which are hereby incorporated by reference.

TECHNICAL FIELD

The present invention relates to a battery pack and a manufacturing method therefor.

BACKGROUND ART

In general, a battery pack includes a battery cell and a protection circuit module electrically connected to the battery cell. The protection circuit module controls charging and discharging of the battery cell. The protection circuit module includes a protection device such as a positive temperature coefficient (PTC) device or a thermal fuse, and prevents electric current from flowing to/from the exterior of a battery when the temperature of the battery dramatically rises or abnormality occurs to the battery at a predetermined voltage due to excessive charging or discharging of the battery.

In addition, the protection device is welded to a tab plate of the protection circuit module, and thus may be electrically connected to the battery cell. Here, an electrode tab and the tab plate are welded to each other by laser welding, and a plurality of welding beads are formed as a result of the laser welding. However, the plurality of welding beads may have different sizes according to the order in which the respective welding beads are formed, making it difficult to maintain a uniform welding strength between the electrode tab and the tab plate.

The above information disclosed in this Background section is only for enhancement of understanding of the background of the described technology and therefore it may contain information that does not form the prior art that is already known in this country to a person of ordinary skill in the art.

DESCRIPTION OF EMBODIMENTS

Technical Problem

Provided is a battery pack capable of securing a welding strength between a tab plate and an electrode tab, and a manufacturing method therefor.

Solution to Problem

According to an aspect of the present invention, a battery pack may include: a battery cell from which an electrode tab is withdrawn; and a protection circuit module which is electrically connected to the battery cell and which has a circuit board and a tab plate formed on one surface of the circuit board and electrically connected to the electrode tab, wherein the tab plate has a through hole for heating the electrode tab.

The protection circuit module may further include a welding hole penetrating the circuit board and formed on the tab plate.

The tab plate and the electrode tab may be electrically connected to each other by laser welding, and welding beads may be formed on surfaces of the tab plate and the electrode tab.

The welding beads may include a first welding bead formed at one side of the through hole; a second welding bead formed to be spaced apart from the first welding bead in a first direction; a third welding bead formed to be spaced apart from the first welding bead in a second direction perpendicular to the first direction; and a fourth welding bead formed to be spaced apart from the third welding bead in the first direction, wherein the first to fourth welding beads have the same size.

According to another aspect of the present invention, a battery pack may include: a battery cell from which an electrode tab is withdrawn; and a protection circuit module which is electrically connected to the battery cell and which has a circuit board and a tab plate formed on one surface of the circuit board and electrically connected to the electrode tab, wherein a dummy bead for heating the tab plate is formed at the center of the tab plate.

According to still another aspect of the present invention, a manufacturing method of a battery pack may include the steps of: placing a protection circuit module on a battery cell so as to bring an electrode tab withdrawn from the battery cell into contact with a tab plate in which a through hole of the protection circuit module is formed; irradiating a laser beam through the through hole to heat the electrode tab; and irradiating the laser beam onto the tab plate to form welding beads for electrically connecting the tab plate and the electrode tab.

In the heating of the electrode tab, 30% of a laser intensity required for fusing the electrode tab may be irradiated.

The forming of the welding beads may include: forming a first welding bead by irradiating the laser beam onto one side of the through hole at a first intensity; forming a second welding bead by irradiating the laser beam onto a portion spaced apart from the first welding bead in a first direction at a second intensity lower than the first intensity; forming a third welding bead by irradiating the laser beam onto a portion spaced apart from the first welding bead in a second direction perpendicular to the first direction at a third intensity lower than the second intensity; and forming a fourth welding bead by irradiating the laser beam onto a portion spaced apart from the third welding bead in the first direction at a fourth intensity lower than the third intensity.

According to still another aspect of the present invention, a manufacturing method of a battery pack may include the steps of: placing a protection circuit module on a battery cell so as to bring an electrode tab withdrawn from the battery cell into contact with a tab plate of the protection circuit module; irradiating a laser beam onto the center of the tab plate to form a dummy bead and heating the tab plate; and irradiating the laser beam onto an exterior side of the dummy bead to form a welding bead for electrically connecting the tab plate and the electrode tab.

In the heating of the tab plate, the dummy bead may be formed by fusing the tab plate.

Advantageous Effects of Disclosure

The battery pack according to an embodiment includes a tab plate having a through hole, and thus may heat in advance an electrode tab positioned under the tab plate through the through hole. Accordingly, the battery pack according to the present invention is capable of securing a stable welding strength between the tab plate and the electrode tab by forming welding beads having the same size.

MODE OF DISCLOSURE

Figure 1:
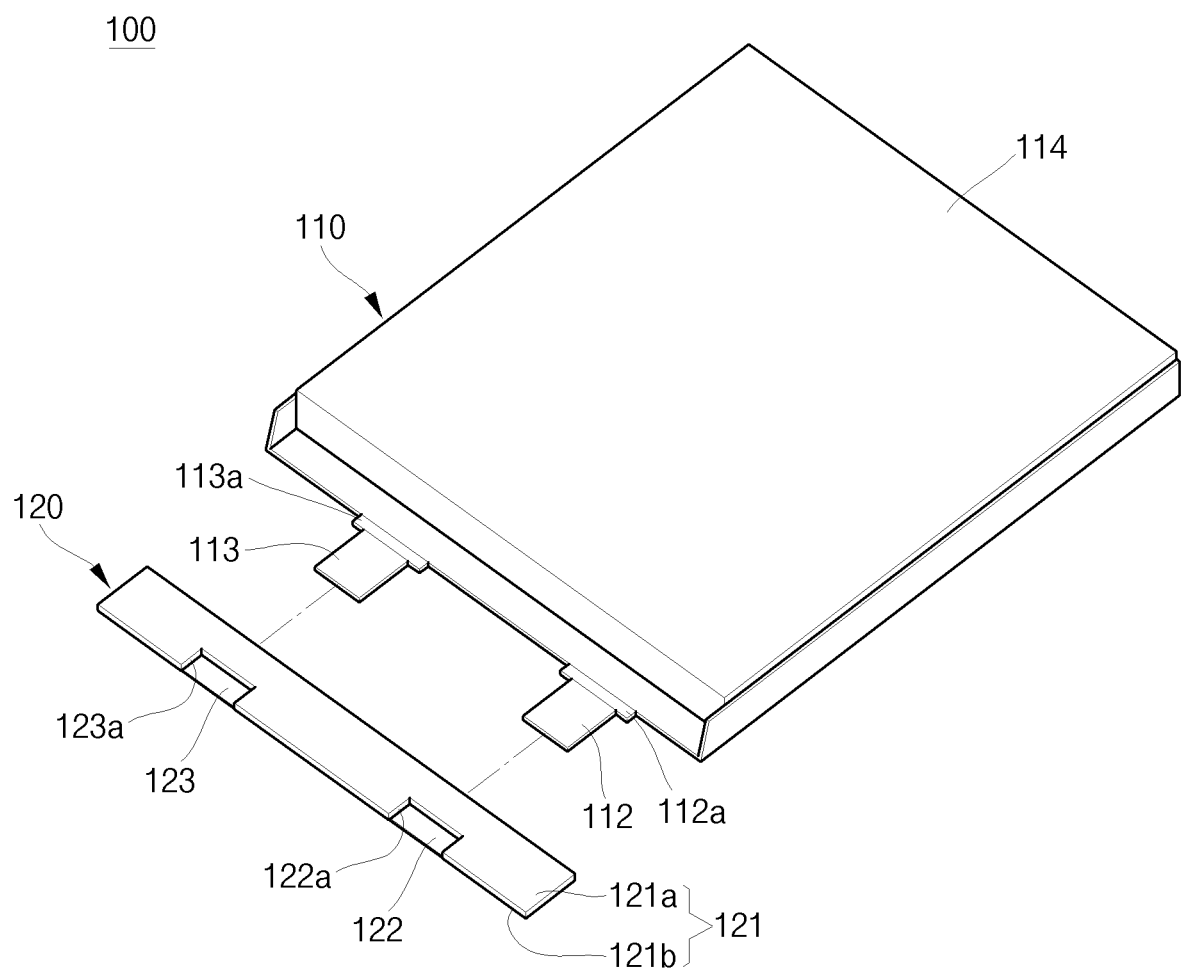
FIG. 1 is an exploded perspective view of a battery pack according to an embodiment of the present invention.

Hereinafter, example embodiments of the present invention will be described in detail.

Various embodiments of the present invention are provided for a more complete understanding of the disclosure and may be embodied in many different forms and should not be construed as being limited to the following example embodiments. Rather, these example embodiments of the disclosure are provided so that this disclosure will be thorough and complete and will convey inventive concepts of the disclosure to those skilled in the art.

In addition, in the drawings, the thicknesses and relative sizes of various layers may be exaggerated for clarity. Like numbers refer to like elements throughout. As used herein, the term "and/or" includes any and all combinations of one or more of the associated listed items.

In addition, spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "on" or "above" the other elements or features. Thus, the exemplary term "below" can encompass both an orientation of above and below.

Figure 2:
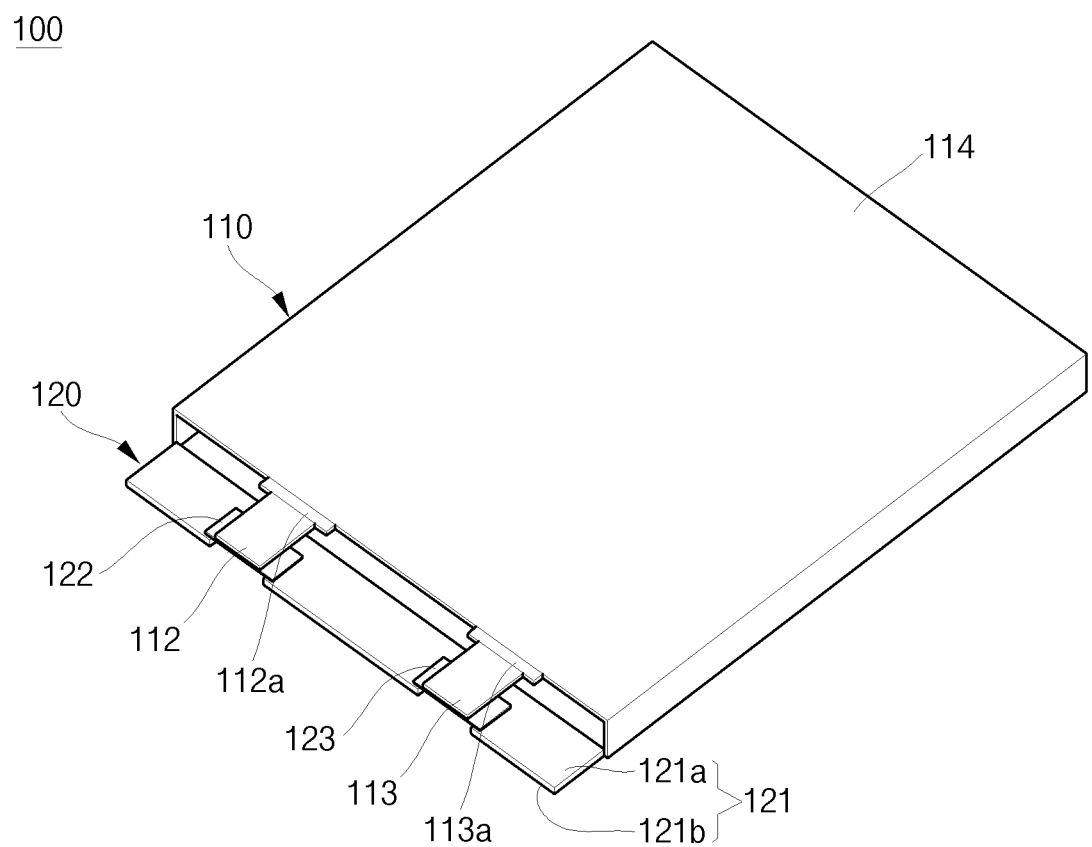
FIG. 2 is a perspective view of the battery pack according to an embodiment of the present invention.
Figure 3:
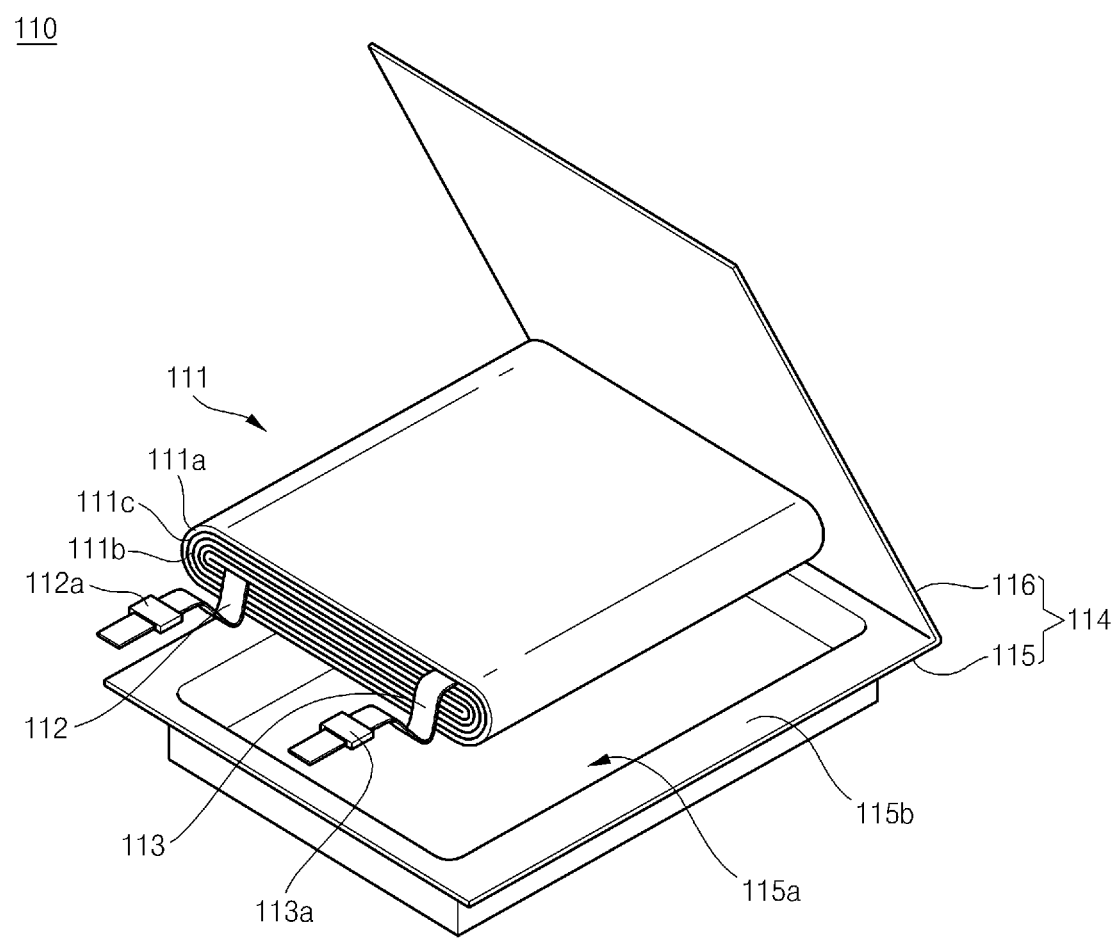
FIG. 3 is an exploded perspective view of a battery cell shown in FIG. 1.

FIG. 1 is an exploded perspective view of a battery pack according to an embodiment of the present invention. FIG. 2 is a perspective view of the battery pack according to an embodiment of the present invention. FIG. 3 is an exploded perspective view of a battery cell shown in FIG. 1.

Referring to FIGS. 1 to 3, the battery pack 100 according to an embodiment of the present invention includes a battery cell 110 and a protection circuit module 120.

The battery cell 110 includes an electrode assembly 111 and a case 114 accommodating the electrode assembly 111. The electrode assembly 111 is formed by winding or stacking a stack of a first electrode 111a, a separator 111c and a second electrode 111b, which are shaped of thin plates or layers. Here, the first electrode 111a may operate as a cathode, and the second electrode 111b may operate as an anode. Of course, polarities of the first electrode 111a and the second electrode 111b may be reversed according to the choice made by a person skilled in the art.

The first electrode 111a may be formed by coating a first electrode active material such as a transition metal oxide on a first electrode collector formed of a metal foil made of, e.g., aluminum, and may include a first electrode uncoated portion that is a portion not coated with the first electrode active material. In addition, a first electrode tab 112 is attached to the first electrode uncoated portion. For example, the first electrode tab 112 may be attached to the first electrode uncoated portion by welding. One end of the first electrode tab 112 is electrically connected to the first electrode 111a, and the other end of the first electrode tab 112 extends to an exterior side of the case 114 and protrudes.

The second electrode 111b may be formed by coating a second electrode active material such as graphite or carbon on a second electrode collector formed of a metal foil made of, e.g., copper or nickel, and may include a second electrode uncoated portion that is a portion not coated with the second electrode active material. In addition, a second electrode tab 113 is attached to the second the second electrode uncoated portion. For example, the second electrode tab 113 may be attached to the second the second electrode uncoated portion by welding. One end of the second electrode tab 113 is electrically connected to the second electrode 111b, and the other end of the second electrode tab 113 extends to an exterior side of the case 114 and protrudes.

Here, the first electrode tab 112 and the second electrode tab 113 are covered by insulation members 112a and 113a, and thus may not be electrically shorted to the case 114.

The separator 111c, positioned between the first electrode 111a and the second electrode 111b, prevents electrical shorts while allowing lithium ions to move. The separator 111c may be made of polyethylene, polypropylene, or a composite film of polyethylene and polypropylene. However, the material of the separator 111c is not limited to the example materials described herein.

The case 114 accommodates the electrode assembly 111. For example, the case 114 may be shaped of a pouch so as to accommodate the electrode assembly 111 to then be hermetically sealed. The case 114 consists of a lower case 115 in which the electrode assembly 111 is accommodated, and an upper case 116 coupled to the lower case 115 while covering the electrode assembly 111. An accommodation groove 115a, through which the electrode assembly 111 is accommodated, may be formed in the lower case 115 by pressing, and a sealing part 115b to be sealed with the upper case 116 may be formed along the outer periphery of the accommodation groove 115a. The sealing part 115b may be formed along one side on which the lower case 115 and the upper case 116 are integrally connected to each other, and along the rest three sides. The case 114 has two long sides facing the lower case 115 and the upper case 116, and two short sides perpendicular to the long sides and facing each other. Here, the first and second electrode tabs 112 and 113 of the electrode assembly 111 are withdrawn through one of the two short sides, facing the short side on which the lower case 115 and the upper case 116 are integrally connected to each other. Here, the insulation members 112*a* and 113*a* of the first and second electrode tabs 112 and 113 are sealed to the sealing part 115*b*. That is to say, the insulation members 112*a* and 113*a* are located at portions where the first and second electrode tabs 112 and 113 are in contact with the sealing part 115*b*, thereby preventing the first and second electrode tabs 112 and 113 from being electrically shorted to the case 114.

The case 114 may be formed to have a multi-layered structure including a first insulation layer, a metal layer and a second insulation layer. For example, the first insulation layer, which corresponds to an internal surface of the case 114, may be made of an insulating and thermally adhesive material, and the second insulation layer, which corresponds to an external surface of the case 114, may serve to relax mechanical, chemical impacts with respect to an external electronic device. In addition, the metal layer, which is located between the first insulation layer and the second insulation layer, may prevent external moisture and oxygen from penetrating into the case 114 and may prevent an electrolytic solution contained inside the case 114 from flowing out.

In addition, the case 114 may be shaped of a pouch and may be formed of a can made of a metallic material. That is to say, the battery cell 110 may also have a prismatic shape as well as the pouch shape.

The protection circuit module 120 is electrically connected to the battery cell 110 to control charging/discharging of the battery cell 110. The protection circuit module 120 may include a circuit module board 121 and a plurality of elements formed on the circuit module board 121.

The circuit module board 121 is made of a resin, and is shaped of a substantially planar rectangular plate. For example, the circuit module board 121 may be a printed circuit module board (PCB). In addition, the circuit module board 121 may include a circuit of controlling charging and discharging of the battery cell 110, or a protection circuit such as a circuit for preventing over-discharge or overcharge. The circuit module board 121 may have a first surface 121*a* and a second surface 121*b* opposite to the first surface 121*a*, and a first tab plate 122 and a second tab plate 123, which are coupled to the first and second electrode tabs 112 and 113 of the battery cell 110, respectively, are formed on the second surface 121*b*. In detail, the first electrode tab 112 is electrically connected to the first tab plate 122 by laser welding, and the second electrode tab 113 is electrically connected to the second tab plate 123 by laser welding. The laser welding may be performed at four points, and as the result of laser welding, welding beads B1 to B4 are formed at welding points (see FIG. 4).

In addition, the first electrode tab 112 and the second electrode tab 113 are coupled to the second surface 121*b* of the circuit module board 121. That is to say, the first and second electrode tabs 112 and 113, the first and second tab plates 122 and 123, and the circuit module board 121 are formed sequentially in that order from below. Therefore, the circuit module board 121 is placed on the first and second electrode tabs 112 and 113 and is oriented so as to correspond to the accommodation groove 115*a* of the case 114.

In addition, a first welding hole 122*a* and a second welding hole 123*a* are formed in the circuit module board 121 for welding the first tab plate 122 and the second tab plate 123 to the first electrode tab 112 and the second electrode tab 113. That is to say, the first welding hole 122*a* is formed on the first tab plate 122 while passing through the circuit module board 121, and the second welding hole 123*a* is formed on the second tab plate 123 while passing through the circuit module board 121. The first and second welding holes 122*a* and 123*a* are formed for the purpose of welding the first and second tab plates 122 and 123 with the first and second electrode tabs 112 and 113.

Next, a welding method between the first tab plate and the first electrode tab will be described.

Figure 4:
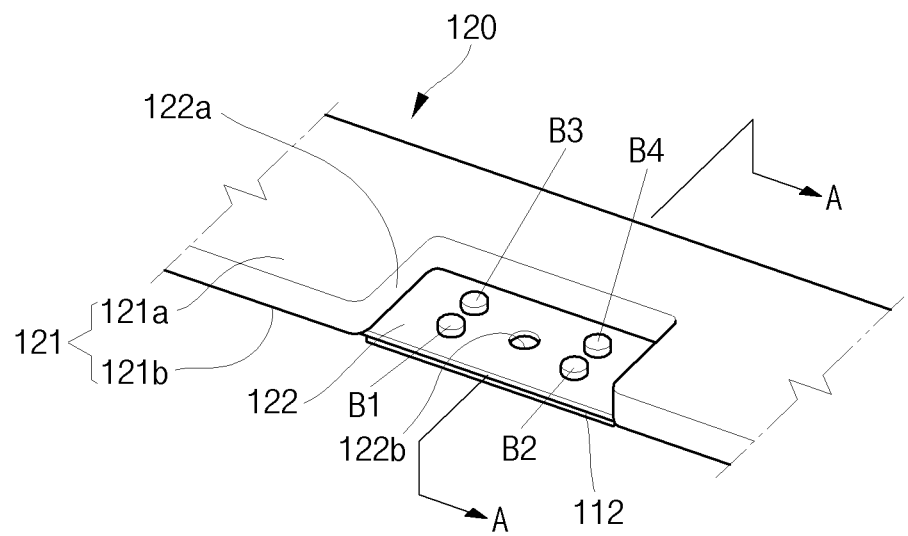
FIG. 4 is a perspective view illustrating a method of welding a first electrode tab and a first tab plate.
Figure 5:
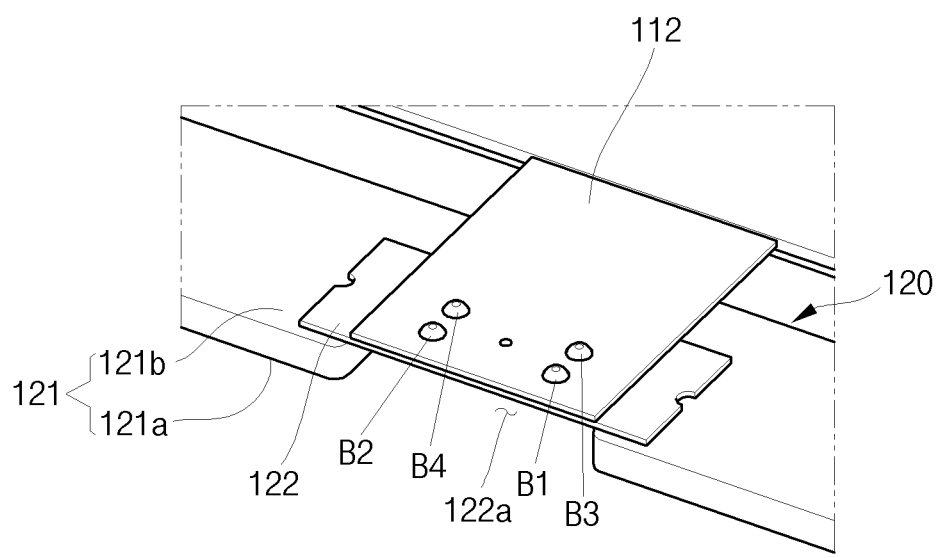
FIG. 5 is a perspective view illustrating a state in which the first electrode tab and the first tab plate shown in FIG. 4 are turned upside down.
Figure 6:
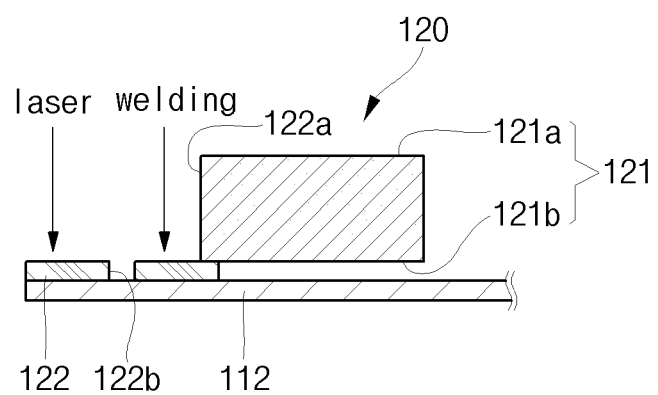
FIG. 6 is a cross-sectional view taken along the line A-A of FIG. 4.

FIG. 4 is a perspective view illustrating a method of welding a first electrode tab and a first tab plate. FIG. 5 is a perspective view illustrating a state in which the first electrode tab and the first tab plate shown in FIG. 4 are turned upside down. FIG. 6 is a cross-sectional view taken along the line A-A of FIG. 4.

Meanwhile, although only the method of welding the first electrode tab and the first tab plate has been described with reference to FIGS. 4 to 6, the second electrode tab and the second tab plate may be welded in the same manner, and a description thereof will be omitted.

As shown in FIGS. 4 to 6, a through hole 122*b* is formed in the first tab plate 122. The through hole 122*b* may be roughly centrally formed in the first tab plate 122 and may be circular. The through hole 122*b* is a hole for heating the first electrode tab 112 in advance when welding the first tab plate 122 to the first electrode tab 112. The first electrode tab 112 is heated to a predetermined temperature by irradiating a laser beam through the through hole 122*b*, and thus welding beads B1 to B4 may be formed between the first tab plate 122 and the first electrode tab 112 so as to have a uniform size.

Here, the laser welding is performed such that two metal plates are superposed and welded by irradiating the laser beam from above. Thus, a heat transferred to a lower metal plate (i.e., a first electrode tab) by the laser beam may be lower than that of an upper metal plate (a first tab plate). And the lower metal plate (the first electrode tab) may be gradually heated according to the progress of welding. Accordingly, there may be a variation in the size between an earlier formed welding bead and a later formed welding bead. That is to say, the earlier formed welding bead may be lower than the later formed welding bead because the lower metal plate (the first electrode tab) is insufficiently heated, while the later formed welding bead may be larger than the earlier formed welding bead because the lower metal plate (the first electrode tab) is gradually heated. As such, the welding beads having different sizes will have different welding strengths, thereby making it difficult to secure a stable welding strength between the electrode tab and the tab plate.

To this end, according to the present invention, the through hole 122*b* is formed in the first tab plate 122, and the laser beam is irradiated onto the through hole 122*b* to heat the first electrode tab 112 in advance, thereby forming the welding beads B1 to B4 between the first tab plate 122 and the first electrode tab 112 so as to have the same size, and ultimately securing a uniform and stable welding strength.

First, the protection circuit module 120 is placed on the first electrode tab 112 to bring the first tab plate 122 into contact with a top surface of the first electrode tab 112. Here, the first electrode tab 112 and the first tab plate 122 may be made of the same metal or different metals. For example, the first electrode tab 112 and the first tab plate 122 may be both made of nickel (Ni), or the first electrode tab 112 may be made of aluminum (Al) and the first tab plate 122 may be made of nickel (Ni).

Then, the laser beam is irradiated through the through hole 122b formed in the first tab plate 122 to heat the first electrode tab 112 at a constant temperature. Here, as shown in FIG. 5, the irradiating of the laser beam through the through hole 122b may leave a mark on a location of the first electrode tab 112 corresponding to the through hole 122b. Of course, no mark may be left on the first electrode tab 112 according to the intensity of laser beam irradiated. Here, the intensity of the laser beam irradiated through the through hole 122b may be about 30% of a reference intensity required for fusing the first electrode tab 112. In addition, when the laser beam is irradiated onto the first electrode tab 112, the heat may be transferred to the first tab plate 122 placed on the first electrode tab 112, and thus the temperature of the first tab plate 122 may rise.

Next, the laser beam is irradiated from above the first tab plate 122 through the first welding hole 122a formed in the circuit module board 121, thereby welding the first tab plate 122 and the first electrode tab 112 to each other. Here, the laser welding may be performed at four points, and thus four welding beads B1 to B4 may be formed. First, the laser beam is irradiated onto one side of the through hole 122b at a first intensity, and thus a first welding bead B1 is formed. Then, the laser beam is irradiated onto a portion spaced apart from the first welding bead B1 in a first direction at a second intensity, and thus a second welding bead B2 is formed. Here, the first welding bead B1 and the second welding bead B2 may be symmetrical with each other on the basis of the through hole 122b. Next, the laser beam is irradiated onto a portion spaced apart from the first welding bead B1 in a second direction at a third intensity, and thus a third welding bead B3 is formed. Here, the second direction is perpendicular to the first direction. Then, the laser beam is irradiated onto a portion spaced apart from the third welding bead B3 in the first direction at a second intensity, and thus a fourth welding bead B4 is formed. Therefore, the first and third welding beads B1 and B3 are positioned at one side of the through hole 122b, and the second and fourth welding beads B2 and B4 are positioned at the other side of the through hole 122b.

In addition, with regard to the laser intensity, the second intensity is lower than the first intensity, the third intensity is lower than the second intensity, and the fourth intensity is lower than the third intensity. Since temperatures of the first tab plate 122 and the first electrode tab 112 gradually increase according to the progress of the laser welding, in order to form the welding beads B1 to B4 so as to have the same size, the laser intensity may be adjusted to be gradually reduced. In detail, the first intensity may be about 90% of the reference intensity, the second intensity may be about 80% of the reference intensity, the third intensity may be about 70% of the reference intensity, and the fourth intensity may be about 60% of the reference intensity. Here, the reference intensity refers to a laser intensity required for fusing the first tab plate 122. In addition, since the laser beam is irradiated in advance through the through hole 122b to heat the first electrode tab 112 and the first tab plate 122, the first intensity, which amounts to about 90% of the reference intensity, is enough to form the first welding bead B1.

As described above, according to the present invention, the through hole 122b is formed in the first tab plate 122 to heat the first electrode tab 112 in advance, laser intensities are gradually reduced when welding the first tab plate 122 and the first electrode tab 112, and thus welding beads having the same size may be formed, thereby securing a stable welding strength.

Figure 7:
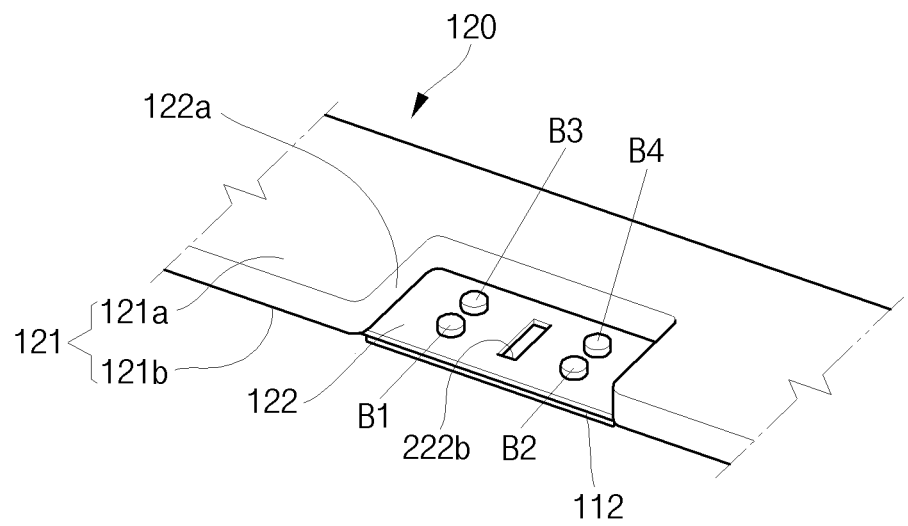
FIGS. 7 and 8 are perspective views illustrating various embodiments of a through hole.
Figure 8:
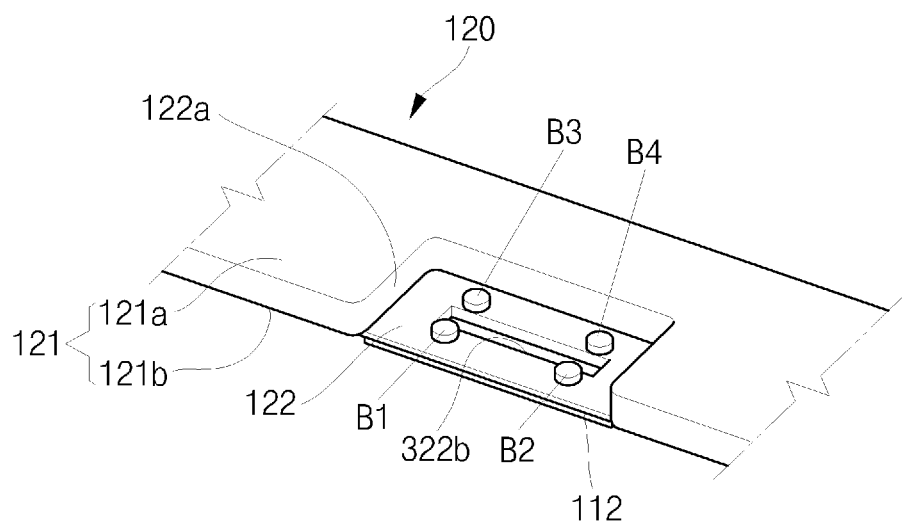

FIGS. 7 and 8 are perspective views illustrating various embodiments of a through hole.

Referring to FIG. 7, a through hole 222b formed in the first tab plate 122 may be rectangular. In detail, the through hole 222b may be shaped of a rectangle elongated in the second direction to make the first and third welding beads B1 and B3 spaced apart from the second and fourth welding beads B2 and B4.

Referring to FIG. 8, a through hole 322b formed in the first tab plate 122 may be rectangular, and is configured to make the first and second welding beads B1 and B2 spaced apart from the third and fourth welding beads B3 and B4. That is to say, the through hole 322b may be shaped of a rectangle elongated in the first direction.

Figure 9:
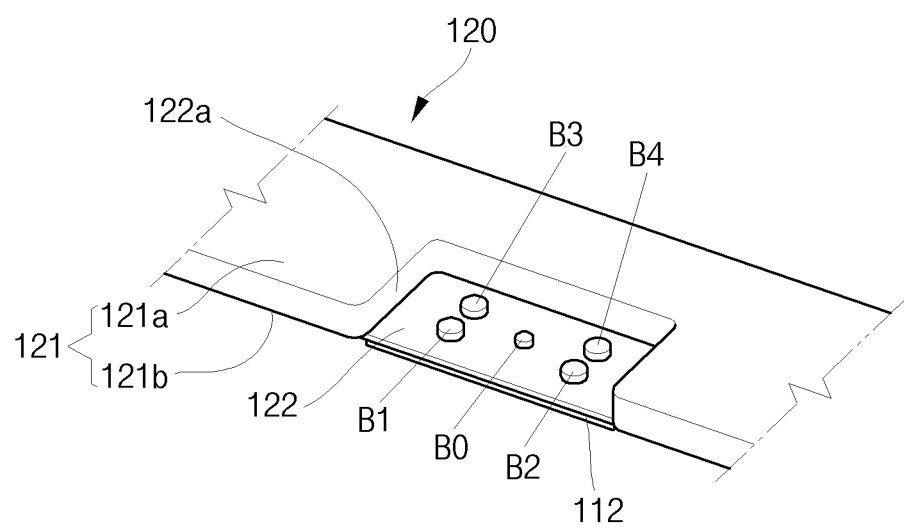
FIG. 9 is a perspective view illustrating a method of welding a first electrode tab and a first tab plate in a battery pack according to another embodiment of the present invention.
Figure 10:
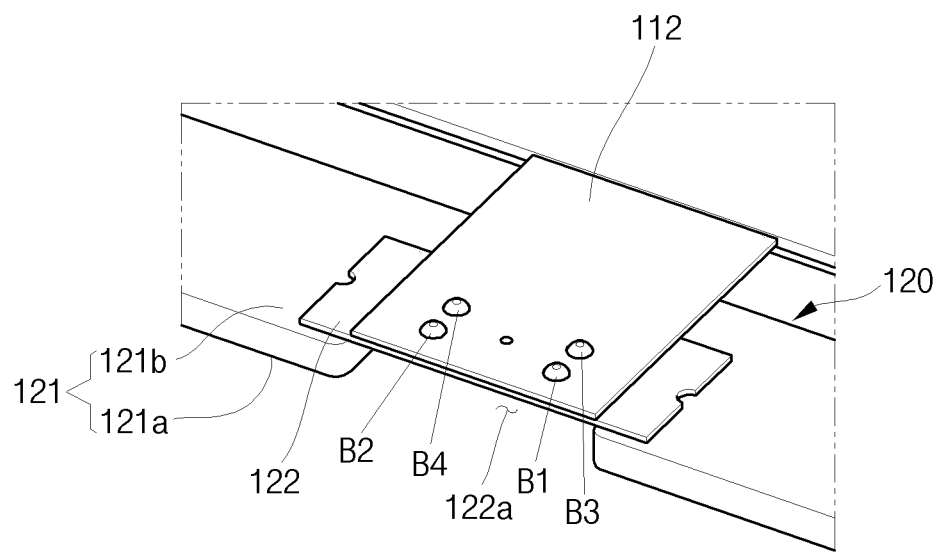
FIG. 10 is a perspective view illustrating a state in which the first electrode tab and the first tab plate shown in FIG. 9 are turned upside down.

FIG. 9 is a perspective view illustrating a method of welding a first electrode tab and a first tab plate in a battery pack according to another embodiment of the present invention. FIG. 10 is a perspective view illustrating a state in which the first electrode tab and the first tab plate shown in FIG. 9 are turned upside down.

As shown in FIG. 9, before welding the first tab plate 122 and the first electrode tab 112 to each other, a dummy bead B0 is formed at the center of the first tab plate 122. The dummy bead B0, which is provided for the purpose of heating the first tab plate 122 in advance, is formed by fusing first tab plate 122 by irradiating a laser beam onto the center of the first tab plate 122. In other words, the dummy bead B0 is a bead for heating the first tab plate 122 in advance, not for welding the first tab plate 122 to the first electrode tab 112. Such a welding method is employed in the case where a melting point of the first tab plate 122 is higher than that of the first electrode tab 112. For example, when the first tab plate 122 is made of nickel (Ni) and the first electrode tab 112 is made of aluminum (Al), the dummy bead B0 is provided to heat in advance the first tab plate 122 having a relatively high melting point. Next, the first welding bead B1, the second welding bead B2, the third welding bead B3 and the fourth welding bead B4 are sequentially formed. Here, the laser intensities are gradually reduced, thereby forming the first to fourth welding beads B1-B4 so as to have the same size.

In addition, as shown in FIG. 10, since the dummy bead B0 is not a bead for welding the first tab plate 122 to the first electrode tab 112, the first to fourth welding beads B1-B4 are just formed on the surface of the first electrode tab 112, and the dummy bead B0 is not separately formed. Of course, according to the intensity of a laser beam irradiated, a negligible mark may be left at a position corresponding to the dummy bead B0 on the surface of the first electrode tab 112.

While the foregoing embodiments have been described to practice the battery pack of the present invention and the manufacturing method therefor, it will be understood by those of ordinary skill in the art that various changes in form and details may be made therein without departing from the spirit and scope of the present invention as defined by the following claims.

The invention claimed is:

1. A battery pack, comprising:
   a battery cell from which an electrode tab extends; and
   a protection circuit module which is electrically connected to the battery cell, and which has a circuit board and a tab plate formed on one surface of the circuit board and electrically connected to the electrode tab,
   wherein:
   the circuit board has a welding hole that penetrates the circuit board and extends to a first edge of the circuit board such that the welding hole has a second edge that is continuous with the first edge while being laterally recessed from the first edge, the welding hole defining an exposed portion of the tab plate, the exposed portion of the tab plate overlies the electrode tab and has a through hole for heating the electrode tab, the through hole exposing the electrode tab, the exposed portion of the tab plate and the electrode tab are electrically connected to each other by laser welding, a plurality of welds being formed by the laser welding at locations that are spaced apart from the through hole, the plurality of welds include a first welding bead, a second welding bead, a third welding bead, and a fourth welding bead, the first welding bead being at one side of the through hole, the second welding bead being spaced apart from the first welding bead in a first direction, the third welding bead being spaced apart from the first welding bead in a second direction perpendicular to the first direction, the fourth welding bead being spaced apart from the third welding bead in the first direction, and the first to fourth welding beads have the same size, and the through hole has a perimeter, the entire perimeter of the through hole being free of welds, and none of the first through fourth welding beads touching the perimeter of the through hole.

2. A battery pack, comprising:

a battery cell from which an electrode tab extends; and a protection circuit module which is electrically connected to the battery cell, and which has a circuit board and a tab plate formed on one surface of the circuit board and electrically connected to the electrode tab, wherein:

the circuit board has a welding hole that penetrates the circuit board and extends to a first edge of the circuit board such that the welding hole has a second edge that is continuous with the first edge while being laterally recessed from the first edge, the welding hole defining an exposed ortion of the tab plate, the exposed portion of the tab plate overlies the electrode tab, has a continuous surface without openings therein, and has a dummy bead for heating the tab plate located at the center of the exposed portion of the tab plate, the dummy bead being a fused portion of the tab plate, and at least two weld beads joining the exposed portion tab plate to the electrode tab are adjacent to the dummy bead, such that the dummy bead is centered between the at least two weld beads.

* * * * *